(12) United States Patent
Lee

(10) Patent No.: US 6,600,329 B2
(45) Date of Patent: Jul. 29, 2003

(54) METHOD FOR INSPECTING ELECTRICAL PROPERTIES OF A WAFER AND APPARATUS THEREFOR

(75) Inventor: Jong-Hoon Lee, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 09/967,959

(22) Filed: Oct. 2, 2001

(65) Prior Publication Data

US 2002/0043970 A1 Apr. 18, 2002

(30) Foreign Application Priority Data

Oct. 18, 2000 (KR) ........................... 2000-61265

(51) Int. Cl.[7] .............................................. G01R 31/02
(52) U.S. Cl. ...................... 324/754; 324/758; 324/765; 324/158.1
(58) Field of Search ................. 324/754, 765, 324/158.1, 759, 758, 73.1; 235/493, 449

(56) References Cited

U.S. PATENT DOCUMENTS

| 5,254,939 A | 10/1993 | Anderson et al. |
| 5,506,498 A | 4/1996 | Anderson et al. |
| 5,517,126 A | * 5/1996 | Yamaguchi ................. 324/758 |
| 5,539,676 A | 7/1996 | Yamaguchi |
| 5,866,024 A | * 2/1999 | De Villeneuve ............ 235/493 |
| 5,886,024 A | 3/1999 | Kluender et al. |

FOREIGN PATENT DOCUMENTS

| JP | 6-120316 | 4/1994 |
| JP | 6-181248 | 6/1994 |
| JP | 10-150082 | 6/1998 |

* cited by examiner

Primary Examiner—Kamand Cuneo
Assistant Examiner—Jimmy Nguyen
(74) Attorney, Agent, or Firm—Volentine Francos, PLLC

(57) ABSTRACT

A method and apparatus for inspecting electrical properties of wafers, includes a probe station in which a probe card and a performance board are installed. Electric signals are transferred to and from a wafer through the probe card and the performance board, which include information members that identify the types of wafers that can be inspected therewith. When it is verified that the probe card and the performance board are respectively usable to inspect the wafer, input inspection information corresponding to the inspection is read by the probe card and the performance board, which are then set to installation conditions for inspection. After placing the wafer on a chuck of the probe station, and then transferring electric signals to and from the wafer through the probe card and the performance board, the electrical properties of the wafer are analyzed based on the electric signals.

18 Claims, 8 Drawing Sheets

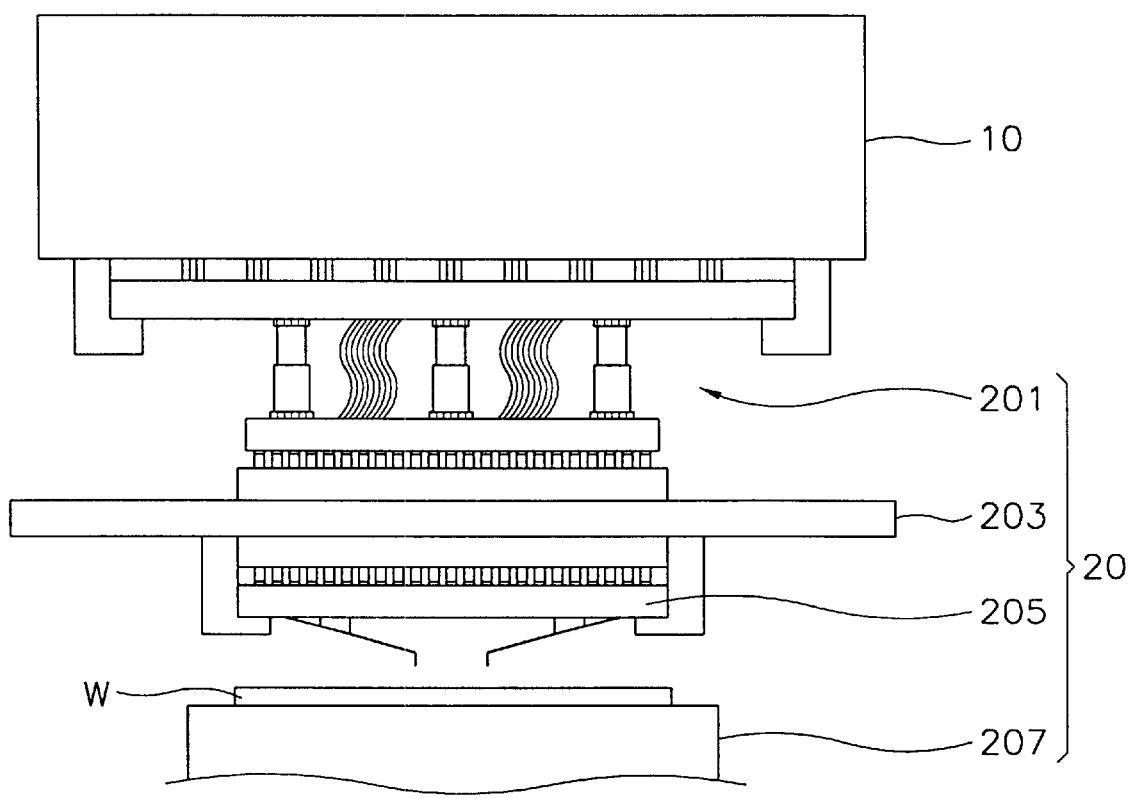

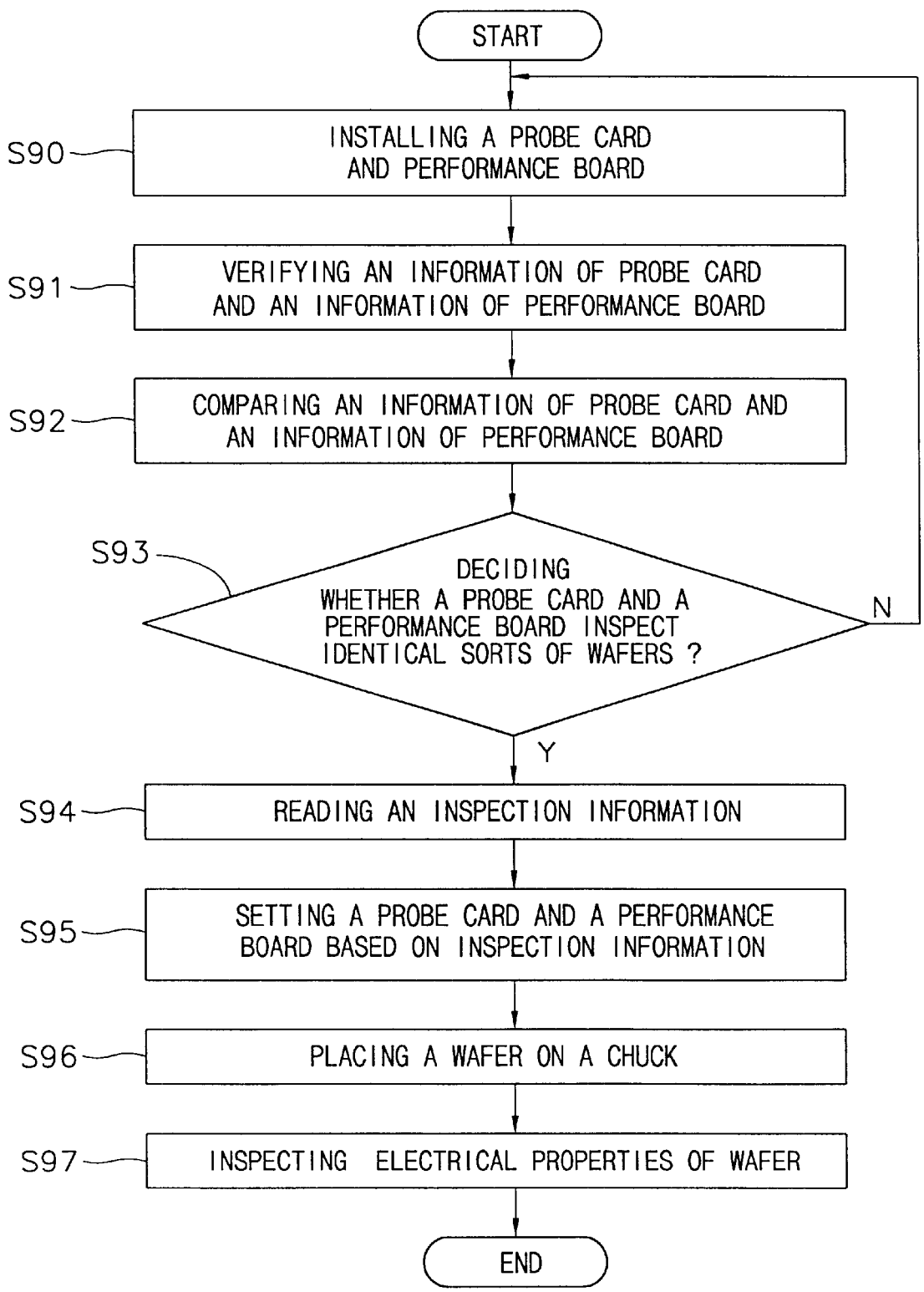

METHOD FOR INSPECTING ELECTRICAL PROPERTIES OF A WAFER AND APPARATUS THEREFOR

The present application claims priority under 35 U.S.C. §119 to Korean Application No. 2000-61265 filed on Oct. 18, 2000, which is hereby incorporated by reference in its entirety for all purposes.

BACKGROUND OF THE INVENTION

1. Field of the Invention

The present invention relates to a method for inspecting electrical properties of a wafer and an apparatus therefor, more particularly to a method for inspecting electrical properties of a wafer by using a probe station having a probe card and a performance board installed therein and an apparatus for inspecting the electrical properties of the wafer.

2. Description of the Related Art

Currently, due to widespread usage of computers in information media, developments in semiconductor memory devices are advancing at a rapid pace, to provide semiconductor devices having high memory storage capacity and faster operating speed. To this end, the current technology is focused on developing and realizing memory devices having a high degree of integration, response speed, and reliability.

A semiconductor device generally may be manufactured by using a wafer composed of silicon (Si). In general, the manufacturing technology of semiconductor devices includes a fabrication process and an assembly process. In the fabrication process, a structure having integrated circuits is manufactured by repeatedly forming predetermined patterns on a wafer. Also, in the assembly process, the wafer having the structure thereon is cut into chip units, and then the chips are packaged. An electrical die sorting (EDS) process is carried out between the fabrication and the assembly processes, so as to inspect electrical properties of the structure formed on the wafer.

During the electric die sorting process, the structure on the wafer is inspected to determine whether the structure has good or bad electrical properties. A structure having bad electrical properties is removed during the electric die sorting process before the assembly process is performed, so that manufacturing effort and cost may be reduced during the assembly process and so that a structure having bad electric qualities is detected early and repaired.

Electric die sorting processes for inspecting electrical properties of a wafer are disclosed in Japanese Patent Laid Open Publication No. Hei 6-181248, Japanese Patent Laid Open Publication No. Hei 10-150082, U.S. Pat. No. 5,254,939 (issued to Anderson et al.), U.S. Pat. No. 5,506,498 (issued to Anderson et al.) and U.S. Pat. No. 5,886,024 (issued to De Villeneuve).

In electric die sorting processes for inspecting the electrical properties of a wafer, the electrical properties of a structure on the wafer are inspected by a probe station having a probe card and a performance board therein. Then, a tester verifies the inspection result from the electric die sorting processes for inspecting the electrical properties of the wafer. In this case, the structure on the wafer may be a 64 mega bit direct random access memory (DRAM) or a 256 mega bit DRAM, for example. Hence, elements such as the probe card and the performance board of the probe station should be suitably installed according to the structure to be inspected.

However, the probe card and the performance board have a construction such that a user manually installs the probe card and the performance board in the probe station in accordance with the inspection process, so that the probe card and the performance board frequently do not correctly match the structure on the wafer.

To overcome such a problem, elements such as the probe card and the performance board are automatically installed by using a computer, as in U.S. Pat. No. 5,254,939. Also, in U.S. Pat. No. 5,506,498, information members are formed on the probe card, and the information members include information identifying that the probe card inspects predetermined sorts of wafers. Furthermore, Japanese Patent Laid Open Publication No. Hei 10-150082 presents discrimination numbers endowed to the probe card and the performance board, which identify the type of the probe card and the performance board. Therefore, a probe card and a performance board that are suitable to a structure having an integrated circuit (IC) formed on a wafer, are installed in the probe station by utilizing the information members or the discrimination numbers.

Although a probe card and a performance board suitable to the structure may be installed in the probe station by using the information members or the discrimination numbers, the inspection process is however continuously disturbed due to various installations of the probe card and the performance board. This is because the probe card and the performance board are not verified as to whether or not they respectively match a probe card and a performance board required to inspect identical sorts of wafers from among some wafers to be inspected during the inspection process. That is, the information member or the discrimination numbers can be respectively verified for a probe card and performance board. However, the information member or the discrimination numbers cannot be used to decide whether a probe card and a performance board respectively match a probe card and a performance board for inspecting identical sorts of wafers.

For example, when a wafer having a structure such as a 64 mega bit DRAM is inspected, the probe card and the performance board should be suitable for the structure of the 64 mega bit DRAM. Hence, the probe card and the performance board are installed after the probe card and the performance board are sufficiently verified. However, it is difficult to verify one of the probe card and the performance board when the probe card for inspecting a 256 mega bit DRAM or the performance board for inspecting a 256 mega bit DRAM are already installed.

Therefore, an inferior inspection process frequently occurs and the manufacturing reliability of the semiconductor device is reduced, because information about the probe card cannot be compared with information about the performance board, even though the probe card and the performance board should be verified by using the information members or the discrimination numbers.

SUMMARY OF THE INVENTION

The present invention is therefore directed to a method for inspecting electrical properties of a wafer and an apparatus therefor, which substantially overcome one or more of the problems due to the limitations and disadvantages of the related art.

It is therefore a first objective of the present invention to provide a method for inspecting electrical properties of a wafer, which enables verification of a probe card and a performance board in a probe station for inspecting identical sorts of wafers, by providing information members for the probe card and the performance board and by comparing the information members.

It is a second objective of the present invention to provide an apparatus for inspecting electrical properties of a wafer, which enables verification of a probe card and a performance board in a probe station for inspecting identical sorts of wafers, by providing information members for the probe card and the performance board and by comparing the information members.

To accomplish the first objective of the present invention, an embodiment of the present invention provides a method for inspecting electrical properties of a wafer. A probe card and a performance board are installed in a probe station for inspecting electrical properties of wafers, wherein the probe card makes contact with the wafers to transfer an electric signal and to receive an electric signal, and the performance board transfers and receives the electric signal through the probe card. Whether the probe card and the performance board respectively correspond to a probe card and a performance board usable to respectively inspect predetermined sorts of wafers among the wafers is verified. Then, a previously input inspecting information corresponding to an inspection is read out by utilizing the probe card and the performance board, when the probe card and the performance board respectively match the probe card and the performance board usable to inspect identical wafers among the wafers, after comparing a verified result concerning the probe card with a verified result concerning the performance board. The probe card and the performance board are set to an installation condition for inspecting on the basis of the inspection information, and a wafer to be inspected is placed on a chuck of the probe station. The electric signal is transferred to the wafer and an electric signal is received from the wafer through the probe card and the performance board, and electrical properties of the wafer are analyzed based on the electric signal.

The probe card and the performance board may be verified by reading integrated circuit chips respectively installed in the probe card and the performance board, or by reading bar codes respectively installed on the probe card and the performance board.

The inspection information comprises information regarding a size of a wafer for inspection, information regarding a position of a flat zone of a wafer or information regarding sizes of chips formed on a wafer. Such information becomes installation information standards for installing the probe card and the performance board in order to inspect the wafer.

The setting of the probe card and the performance board proceed by comparing installation conditions of the probe card and the performance board with installation conditions according to the inspection information and by manually proceeding according to the result generated from the comparing step. Also, the setting of the probe card and the performance board proceed by comparing installation conditions of the probe card and the performance board with installation conditions according to the inspection information and by automatically proceeding according to the result generated from the comparing step. The setting step including the arrangements of the probe card and the performance board is performed since the probe card and the performance board are manually installed in the installing.

The information read from the probe card and the performance board is compared, so the inspection process is prevented from proceeding when the probe card and the performance board have different constructions with respect to each other. Also, the information of the probe card and the performance board are previously verified so that the installation conditions of the probe card and the performance board are automatically set for inspecting. Therefore, electrical properties of the wafer can be accurately inspected.

Also, to accomplish the second objective of the present invention, one preferred embodiment of the present invention provides an apparatus for inspecting electrical properties of a wafer, including a probe station for installing a probe card for contacting with wafers to transfer an electric signal and to receive an electric signal, and a performance board for transferring and receiving the electric signal through the probe card, wherein information members are respectively provided to the probe card and the performance board, the information members including information identifying that the probe card and the performance board are respectively for inspecting predetermined sorts of wafers among the wafers. A reader reads the information members and a controller sets the probe card and the performance board to installation conditions for inspection in view of inspection information, wherein the controller reads previously input inspection information corresponding to an inspection by using the probe card and the performance board, when the probe card and the performance board respectively correspond to a probe card and a performance board which inspect identical sorts of wafers, after the controller receives information generated from the reader and compares information about the probe card with information about the performance board.

The information members may be integrated circuit chips installed in the probe card and the performance board, respectively. Also, the information members may include bar codes attached to the probe card and the performance board, respectively.

The controller has a monitor for monitoring installation conditions of the probe card and the performance board and installation conditions according to the inspection information, and an operator for manually manipulating the installation conditions of the probe card and the performance board by monitoring of the monitor. Also, the controller further includes a comparer for comparing installation conditions of the probe card and the performance board with installation conditions of the inspection information, and an automatic controller for setting installation conditions of the probe card and the performance board with automatic control based on data, after the automatic controller receives the data generated from the comparer. The automatic controller sets installation conditions of the probe card and the performance board with automatic control according to numerical control.

According to the present invention, inferiority due to incorrect installation of the probe card and the performance board can be minimized, because of inspecting whether or not the probe card and the performance board installed in the probe station are usable to inspect identical sorts of wafers. Then, successive processes are carried out on the basis of the result from the decision, so inspection reliability for semiconductor devices can be enhanced. Also, the desired time for inspecting the semiconductor devices can be reduced because of easy setting of the probe card and the performance board based on of the inspection information according to the result. Therefore, productive use of the semiconductor devices can be increased due to the inspection of the semiconductor devices.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a schematic structural view showing an apparatus for inspecting electrical properties of a wafer according to an embodiment of the present invention;

FIG. 9 is a flow chart illustrating a method for inspecting electrical properties of a wafer according to an embodiment of the present invention.

DESCRIPTION OF THE PREFERRED EMBODIMENTS

Figure 2A:
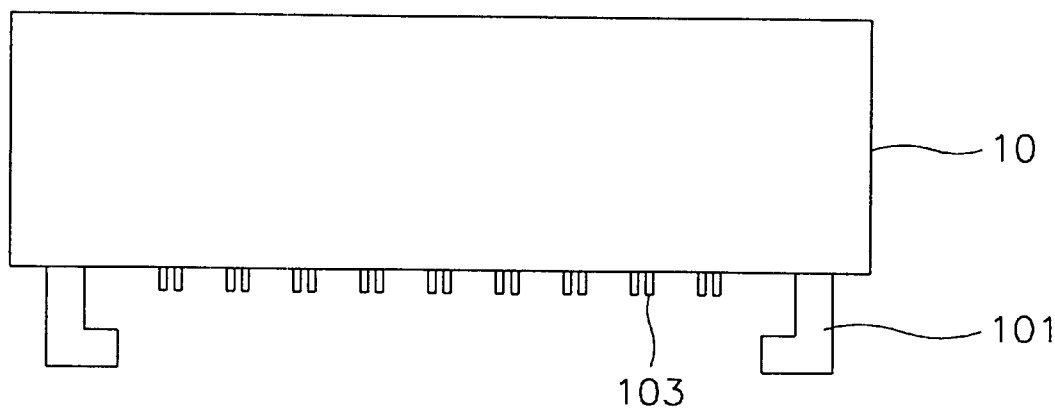
FIGS. 2A to 2E are detailed schematic views showing the elements installed in the apparatus for inspecting electrical properties of the wafer of FIG. 1.

Hereinafter, the present invention will now be described more fully with reference to the accompanying drawings, in which preferred embodiments of the present invention are shown.

FIG. 1 is a schematic structural view showing an apparatus for inspecting electrical properties of a wafer according to an embodiment of the present invention. Referring to FIG. 1, the apparatus for inspecting electrical properties of the wafer includes a tester 10 that generates an electric signal that is transferred to a wafer W. Also, the tester 10 analyzes the electric signal after the electric signal is transferred back from wafer W, and tester 10 then inspects whether or not the wafer has desired electrical properties.

A probe station 20 transfers the electric signal from tester 10 to the wafer W, and also transfers the electric signal from the wafer W to the tester 10. The probe station 20 includes a performance board 201, a head plate 203, a probe card 205 and a chuck 207 on which the wafer W is placed. The performance board 201 is disposed between the tester 10 and the probe card 205, so that the performance board 201 transfers and receives the electric signal. The probe card 205 makes contact with the wafer W to transfer the electric signal and to receive the electric signal. The head plate 203 having pogo pins is installed between the probe card 205 and the performance board 201.

FIGS. 2A to 2E are detailed structural views showing the elements of the apparatus for inspecting electrical properties of a wafer shown in FIG. 1.

FIG. 2A shows the tester 10 of FIG. 1. Referring to FIG. 2A, the tester 10 has first supporting bars 101 and pogo pins 103. The first supporting bars 101 support the performance board 201 when installed in the probe station 20. The pogo pins 103 make contact with the performance board 201 to transfer and to receive an electric signal.

Figure 2B:
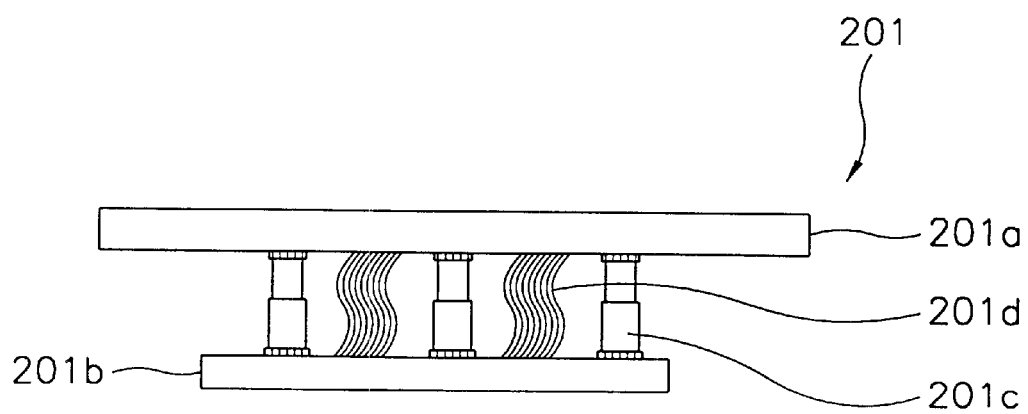

FIG. 2B shows the performance board 201 of FIG. 1. Referring to FIG. 2B, the performance board 201 has a base board 201a and a wafer board 201b. The base board 201a makes contact with the pogo pins 103 of the tester 10 and the wafer board 201b makes contact with the head plate 203 of the probe station 20. The base board 201a and the wafer board 201b are supported by shock absorbers 201c. In this case, shock absorbers 201c absorb the load generated from the tester 10 when the inspection process for the wafer W is performed. The performance board 201 also includes cables 201d for transferring and receiving the electric signal. Hence, the performance board 201 receives and transfers the electric signal from and to the tester 10. Because the tester 10 has a rectangular cross section and the performance board 201 has a circular cross section, the performance board 201 changes various channels including the electric signal transferred and received through the tester 10, so that the channels have circular cross sections corresponding to the circular cross section of the wafer W.

Figure 2C:
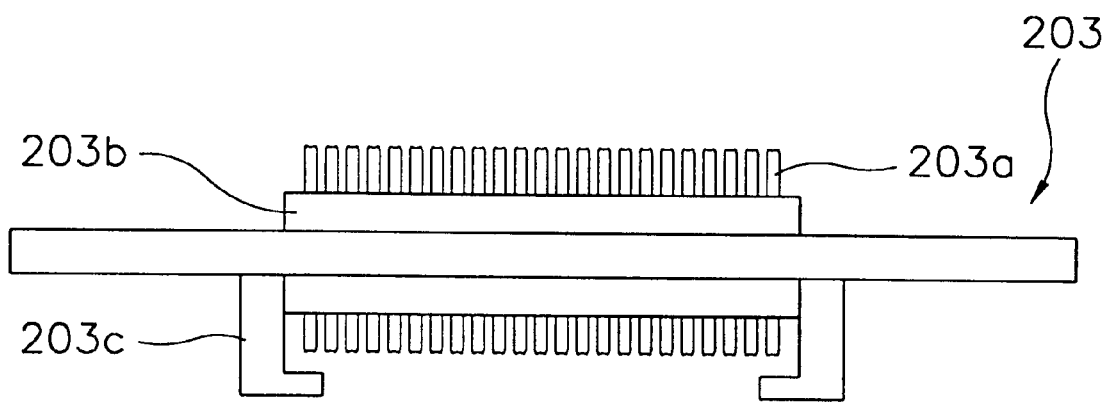

FIG. 2C shows the head plate 203 of FIG. 1. Referring to FIG. 2C, the head plate 203 has pogo pins 203a and a pogo pin ring 203b supporting the pogo pins 203a. Also, the head plate 203 includes second supporting bars 203c for supporting the probe card 205 when the probe card 205 is installed. The pogo pins 203a of the head plate 203 connect the probe card 205 to the performance board 201. In this case, the pogo pins 203a absorb the load between the probe card 205 having a fixed construction and the performance board 201 having a variable construction.

Figure 2D:
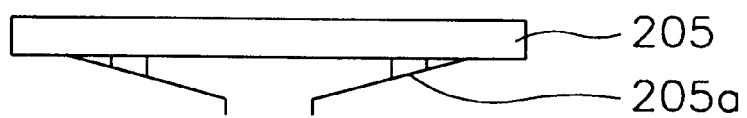

FIG. 2D illustrates the probe card 205 of FIG. 1. Referring to FIG. 2D, the probe card 205 directly makes contact with the wafer W, so that the probe card 205 transfers and receives the electric signal. The probe card 205 includes needles 205a directly contacting with the wafer W.

Figure 2E:
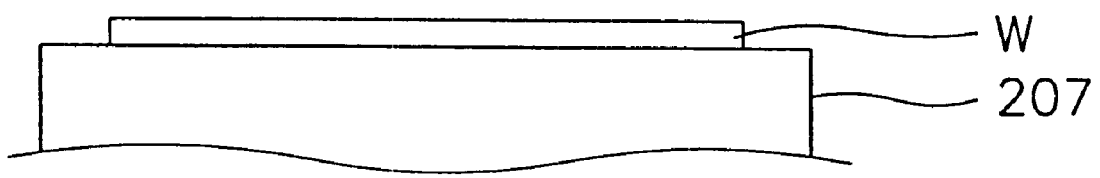

FIG. 2E shows the chuck 207 with the wafer W placed thereon. Referring to FIG. 2E, the wafer W is arranged in the inspection position on the chuck 207 after the wafer W is placed on the chuck 207.

In an inspection process using probe station 20, different performance boards and probe cards may be installed according to the sort or type of wafer W to be inspected. That is, a performance board and a probe card for inspecting electrical properties of a 64 mega bit direct random access memory (DRAM) are installed when the inspection process is executed on a wafer having a construction such as 64 mega bit DRAM. Also, when the inspection process is executed on a wafer having a construction like a 256 mega bit DRAM, a performance board and a probe card for inspecting electric properties of a 256 mega bit DRAM are installed.

Figure 3:
FIG. 3 is a schematic structural view showing the probe card installed in the apparatus for inspecting electrical properties of the wafer, according to the embodiment of FIG. 1.

FIG. 3 is a schematic view showing the probe card installed in the apparatus for inspecting electrical properties of the wafer according to an embodiment of the present invention. Referring to FIG. 3, a first information member 30a is formed on the probe card 205. The first information member 30a has information which identifies that the probe card 205 inspects certain kinds of wafers from among several kinds of wafers. For example, the first information member 30a has information identifying whether the probe card 205 is usable with a wafer having a 64 mega bit DRAM or for a wafer having a 256 mega bit DRAM.

Figure 4:
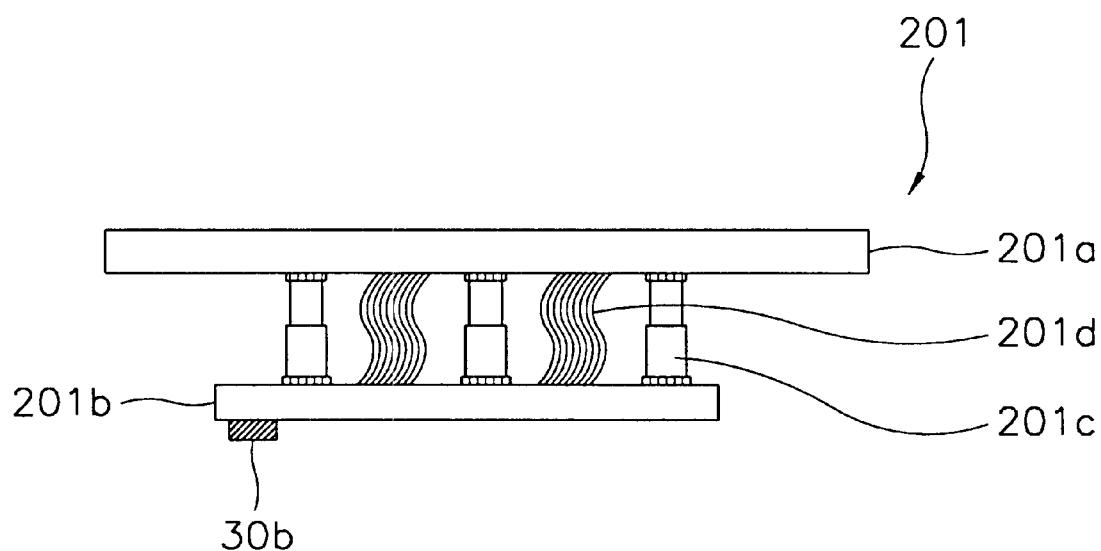
FIG. 4 is a schematic structural view showing the performance board installed in the apparatus for inspecting electrical properties of the wafer according to the embodiment of FIG. 1.

FIG. 4 is a schematic view showing the performance board installed in the apparatus for inspecting electrical properties of the wafer, according to the embodiment of FIG. 1. Referring to FIG. 4, a second information member 30b is provided on the performance board 201, which has information which identifies that the performance board 201 inspects certain kinds of wafers from among several different kinds of wafers. For example, the second information member 30b has information identifying whether the performance board 201 is usable with a wafer having 64 mega bit DRAM or for a wafer having 256 mega bit DRAM.

For example, the first information member 30a and the second information member 30b may be integrated circuit (IC) chips or bar codes, respectively. If the first and the second information members 30a, 30b are IC chips, the first and the second information members 30a, 30b are respectively installed in the probe card 205 and the performance board 201. Also, the first and the second information members 30a, 30b are respectively attached to the probe card 205 and the performance board 201 when the first and the second information members 30a, 30b are bar codes.

Figure 5:
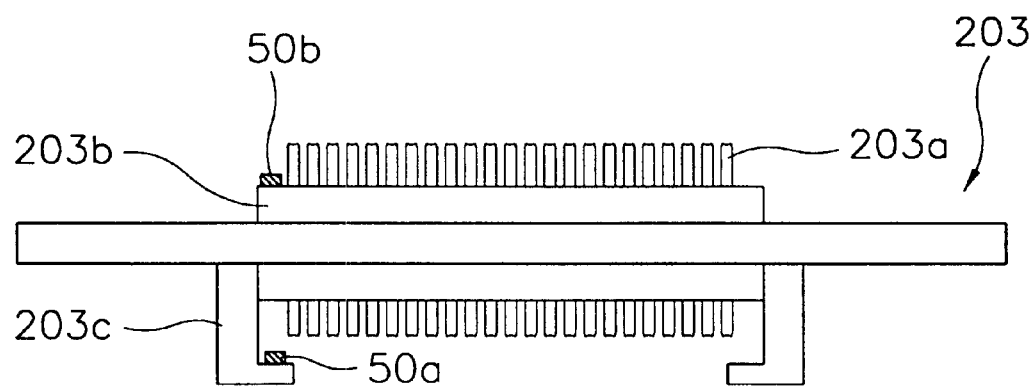
FIG. 5 is a schematic structural view showing a reading member installed in the apparatus for inspecting electrical properties of the wafer according to the embodiment of FIG. 1.

FIG. 5 is a schematic view showing a reading member installed in the apparatus for inspecting electrical properties of the wafer according to an embodiment of the present invention. Referring to FIG. 5, reading members 50a and 50b respectively read the information recorded in the first and the second information members 30a and 30b. The reading members 50a and 50b are respectively disposed on the head plate 203 where the probe card 205 and the performance board 201 are installed. The reading members 50a and 50b may however be placed at locations other than on the head plate 203. That is, the reading members 50a and 50b can be disposed at any positions where information in the first and the second information members 30a and 30b can be read. Accordingly, the information recorded in the first and the second information members 30a and 30b is read by using reading members 50a and 50b, and then the reading members 50a and 50b output the read information. Incidentally, in the case that information members 30a and 30b are IC chips, reading members 50a and 50b may be program readers for example. In the case that information members 30a and 30b are bar codes, reading members 50a and 50b may be bar code readers for example.

Figure 6:
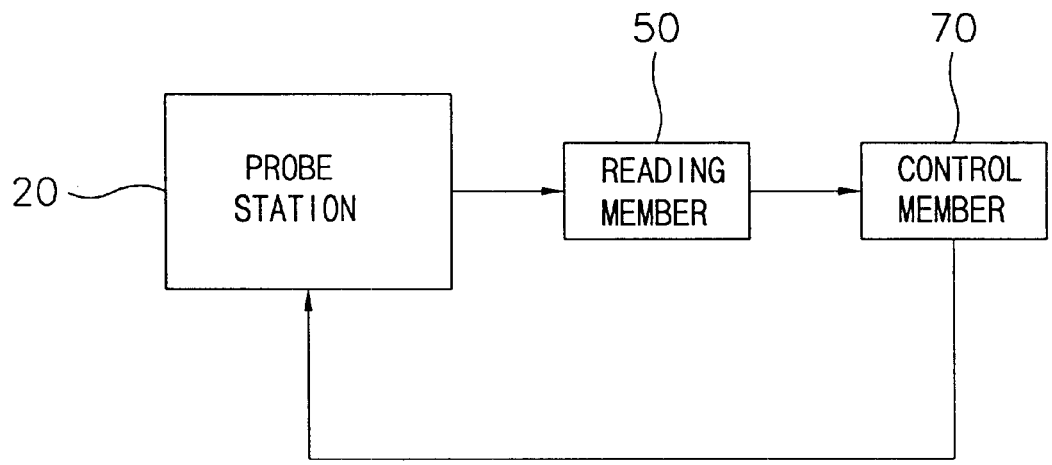
FIG. 6 is a block diagram illustrating the apparatus for inspecting electrical properties of the wafer according to an embodiment of the present invention.

FIG. 6 is a block diagram illustrating the apparatus for inspecting electrical properties of the wafer, according to FIG. 1. With reference to FIG. 6, the probe station 20 includes the probe card 205 and the performance board 201. In this case, the first and second information members 30a and 30b are provided on the probe card 205 and the performance board 201, respectively. Also, reading members 50a and 50b, illustrated as reading member 50, are provided to read the information from the first and second information members 30a and 30b of the probe card 205 and the performance board 201.

A control member 70 is installed in the apparatus for receiving the information from the reading member 50. The control member 70 compares the information read from the probe card 205 with the information read from the performance board 201. The information read from the probe card 205 and the information read from the performance board 201 are information identifying that the probe card and the performance board are for inspecting a kind of wafer from among several different kinds of wafers, respectively. The control member 70 compares the information read from the probe card 205 with the information read from the performance board 201, and then inspects whether or not the probe card 205 and the performance board 201 both respectively correspond to a probe card and a performance board that are used to inspect the particular kind of wafer to be inspected.

Thereafter, the control member 70 reads inspection information that corresponds to the inspection and that was previously input in the control member 70, when it is determined that the probe card 205 and the performance board 201 both respectively correspond to a probe card and a performance board for inspecting the same kind of the wafers. In this case, the inspection information includes the size of the wafer to be inspected, the position of a flat zone of the wafer and/or the dimensions of chips formed on the wafer. On the basis of such inspection information, the control member 70 sets the probe card 205 and the performance board 201 to the initial conditions for performing the inspection process. That is, the probe card 205 and the performance board 201 are set to installation conditions for performing the inspection process, since the probe card 205 and the performance board 201 have been manually installed. In this case, the setting process is accomplished by using the control member 70, because the setting process proceeds in view of the information from the probe card 205 and the performance board 201 and the inspection information.

Figure 7:
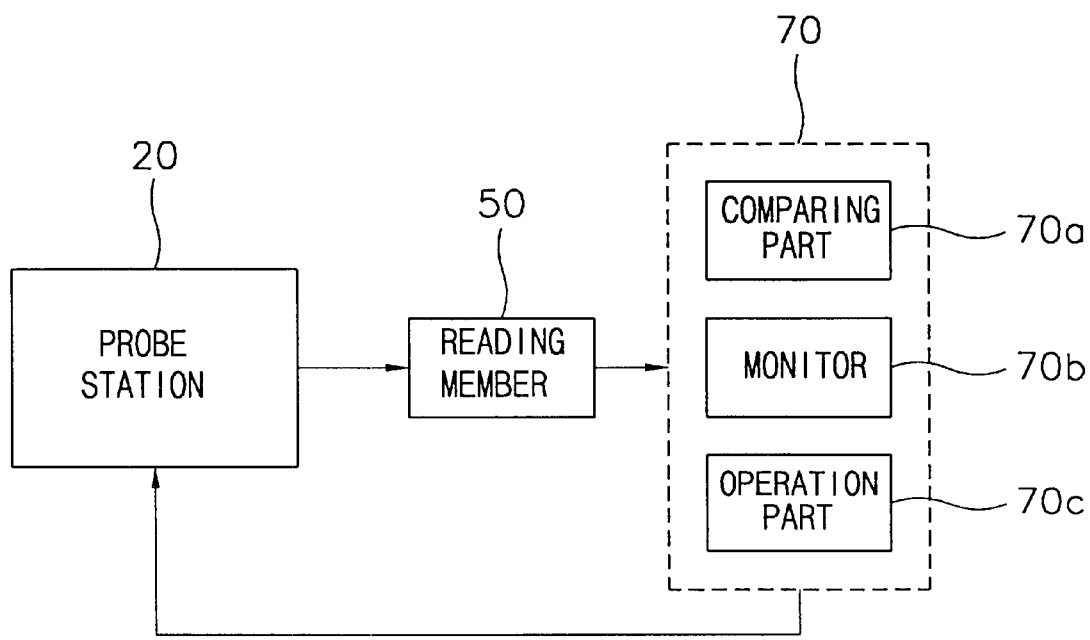
FIGS. 7 and 8 are block diagrams illustrating the control member in FIG. 6.
Figure 8:
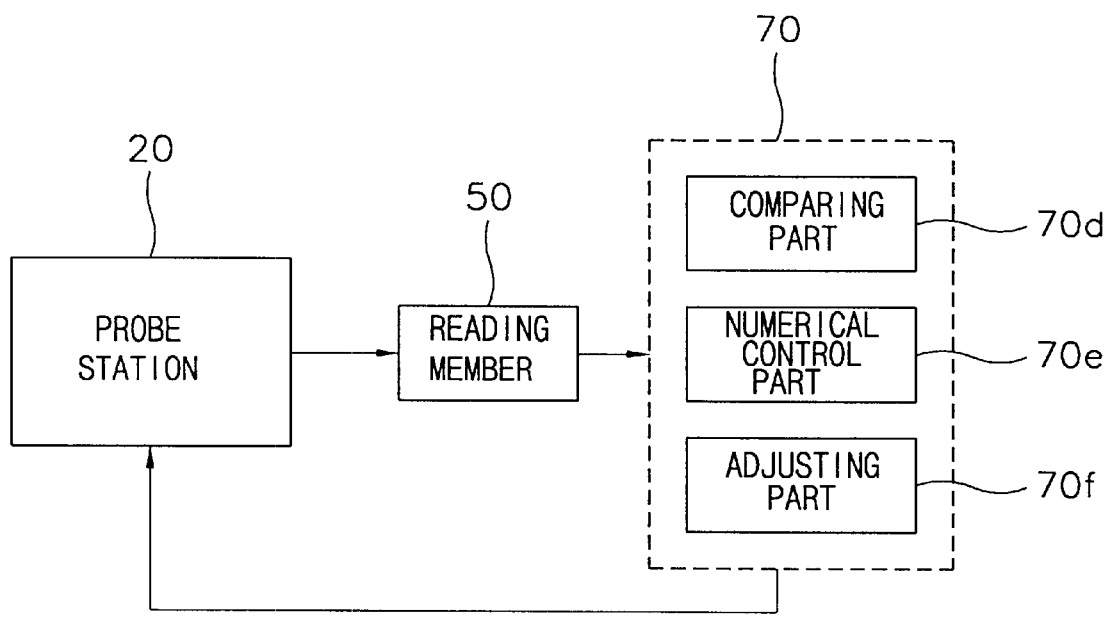

FIGS. 7 and 8 are block diagrams illustrating the control member 70 of FIG. 6. Referring to FIG. 7, the control member 70 has a comparing part 70a, a monitor 70b and an operation part 70c. The comparing part 70a compares the information from the probe card 25 and performance board 201. The monitor 70b monitors the installation conditions of the probe card 205 and the performance board 201 in view of the inspection information. The operation part 70c manually manipulates the setting of the installation conditions on the basis of monitoring by the monitor 70b. The operation part 70c includes a key operation, so that the operation part 70c sets the installation conditions of the probe card 205 and the performance board 201 in view of the key operation. Accordingly, the probe card 205 and the performance board 201 can be set to precise positions by manual operation of the operation part 70c of the control member 70. For example, and not necessarily limited thereto, monitor 70b may be a television monitor, whereby a technician would view monitor 70b and then manually manipulate operations part 70c to set installation conditions. Also, operation part 70c may be a numerical control member for example, capable of being moved in x-axis, y-axis and z-axis directions responsive to manual key operation by a technician.

Referring to FIG. 8, the control member 70 may in the alternative have a comparing part 70d, a numerical control part 70e and an adjusting part 70f. The comparing part 70d compares the information from the probe card 205 and the performance board 201. The numerical control part 70e numerically controls the installation conditions of the probe card 205 and the performance board 201. The adjusting part 70f automatically adjusts the setting of the installation conditions of the probe card 205 and the performance board 201 on the basis of the result data generated by from the numerical control part 70e. Hence, the probe card 205 and the performance board 201 are set to the precise position in this embodiment, since the probe card 205 and the performance board 201 are automatically adjusted by the numerical control part 70e and the adjusting part 70f. Since the inspection information about the probe card 205 and the performance 201 are previously input, the inspection information can be verified with the previously input information. For example, and not necessarily limited thereto, adjusting part 70*f* may be a numerical control member for automatically moving the probe card in x-axis, y-axis and z-axis directions, in accordance with a program inputted in numerical control part 70*e*. Numerical control part 70*e* supplies numerical data to adjusting part of 70*f*.

Hereinafter, a method for inspecting electrical properties of a wafer using the above-described apparatus is described in connection with the flow chart of FIG. 9. Referring to FIG. 9, a probe card and a performance board are installed in an apparatus such as shown in FIG. 1, in step S90. The probe card and the performance board are changed accordingly during inspections, as the probe card and the performance board are suitable to wafers having various constructions when the inspection process proceeds for inspecting wafers.

Subsequently, the information read from the probe card and the information read from the performance board are respectively verified in the step S91. At that time, a reading part reads the information from the probe card and the information from the performance board, and then the information read from the probe card and the information read from the performance board are input into a control part. In step S92, the control part compares the information read from the probe card with the information read from the performance board after the control part receives the information read from the probe card and the information read from the performance board. Thereafter in step S93, the control part decides whether or not the probe card and the performance board inspect identical sorts of wafers. Then in step S94, the inspection information corresponding to an inspection by using the probe card and the performance board is read, when it has been previously determined in step S93 that the probe card and the performance board inspect identical sorts of wafers. In this case, the inspection information is previously input information. Incidentally, if it is determined in step S93 that the probe card and the performance board do not both inspect the same sort of wafer, processing returns to step S90, whereby a new probe card and/or performance board are installed.

For example, when it is determined that the probe card and the performance board are usable to inspect a wafer having a structure such as a 256 mega bit DRAM, the previously input information including the size of the wafer, the position of the flat zone and the dimension of the structure can be read. However, the probe card and the performance board are changed when it is determined that the probe card and the performance board are respectively usable to inspect different wafers. For example, a different probe card and/or a different performance board are selected for use when the probe card corresponds to a 64 mega bit DRAM and the performance board corresponds to a 256 mega bit DRAM.

As described above, the successive process proceeds when it is determined that the probe card and the performance are usable to inspect a same sort of wafer, that is when the probe card and the performance board are verified and the results from the verifying process are compared with each other. Hence, the probe card and the performance are verified without inadequate installation, before the inspection process proceeds.

Subsequently, the probe card and the performance board are set for inspecting the wafer with the inspection information in the step S95. The probe card and the performance board are suitably set to the inspection information on the basis of the size of the wafer, the position of the flat zone and the dimension of the structure like the chip, since the probe card and the performance board are manually installed. The settings of the probe card and the performance board are automatically performed, or manually performed by a user, after verifying the inspection information. When the probe card and the performance board are automatically set, the setting is performed through the inspection information previously input.

The wafer is transferred to be mounted on a chuck of the probe station in step S96. In this case, the wafer installed on the chuck is arranged in accordance with the inspection information. Thus, electrical properties of the wafer can be correctly inspected because the correct probe card and performance board are precisely installed and the wafer also is installed at the precise position of the chuck in the step S97.

The inspection process is accomplished by analyzing an electric signal transferred to a tester through the probe card and the performance board after the probe card makes contact with the wafer, and the electric signal is transferred by means of the tester and the performance board. With this result from the analysis process, a structure having a failed condition is marked with a laser marking, to be corrected during a subsequent process.

Accordingly, a failure generated from incorrect installation of a probe card and a performance board can be minimized by not only verifying the information of the probe card and the information of the performance board, but also by comparing the information of the probe card with the information of the performance board. Also, the settings of the probe card and the performance board are easily performed by utilizing the inspection information generated from the comparing information.

According to the present invention, inferiority in processing due to incorrect installation of the probe card and the performance board can be minimized due to the determination of whether or not the probe card and the performance board installed in the probe station inspect identical sorts of wafer. Then, successive processing ensues on the basis of the result from the determination, so that inspection reliability of semiconductor devices can be enhanced.

Also, the desired time for inspecting the semiconductor devices can be reduced since setting of the probe card and the performance board can be made easy in view of the inspection information. Therefore, the productivity of the semiconductor devices can be increased due to the inspection of the semiconductor devices.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for inspecting electrical properties of a wafer comprising:

installing a probe card and a performance board in a probe station, the probe card making contact with the wafer to transfer electric signals to and from the wafer, and the performance board being operatively connected with the probe card to transfer the electric signals to and from the probe card;

verifying whether the probe card and the performance board respectively correspond to a probe card and a performance board usable to respectively inspect the wafer from among plural wafer types;

reading previously provided inspection information corresponding to an inspection using the probe card and the performance board, when the probe card and the performance board are respectively determined as usable to inspect the wafer during said verifying;

setting the probe card and the performance board to an installation condition for inspecting based on the inspection information;

placing the wafer on a chuck of the probe station;

transferring the electric signals to and from the wafer through the probe card and the performance board; and analyzing the electrical properties of the wafer based on the electric signals.

2. The method for inspecting electrical properties of a wafer of claim 1, wherein said installing comprises manually installing the probe card and the performance board in the probe station.

3. The method for inspecting electrical properties of a wafer of claim 1, wherein said verifying comprises reading integrated circuit chips respectively installed in the probe card and the performance board.

4. The method for inspecting electrical properties of a wafer of claim 1, wherein said verifying comprises reading bar codes respectively installed on the probe card and the performance board.

5. The method for inspecting electrical properties of a wafer of claim 1, wherein the inspection information comprises information indicative of a size of a wafer for inspection, information indicative of a position of a flat zone of a wafer, and information indicative of sizes of chips formed on a wafer.

6. The method for inspecting electrical properties of a wafer of claim 1, wherein said setting comprises:

comparing installation conditions of the probe card and the performance board with installation conditions based on to the inspection information; and manually setting the probe card and the performance board based on said comparing.

7. The method for inspecting electrical properties of a wafer of claim 1, wherein said setting comprises:

comparing installation conditions of the probe card and the performance board with installation conditions based on the inspection information; and automatically setting the probe card and the performance board based on said comparing.

8. An apparatus for inspecting electrical properties of a wafer, comprising:

a probe station in which a probe card and a performance board are installed, the probe card contacting the wafer to transfer electric signals to and from the wafer, and the performance board being operatively connected to the probe card to transfer the electric signals to and from the probe card, the probe card and the performance board having information members respectively provided thereto, the information members including information identifying that the probe card and the performance board are respectively usable to inspect certain wafers from among a plurality of wafers;

a reader that reads the information members and generates information about the probe card and the performance board; and a controller that sets the probe card and the performance board to installation conditions for inspection based on inspection information previously provided, said controller receives the information generated by said reader, compares the information about the probe card with the information about the performance board, and when the probe card and the performance board are respectively determined to correspond to a probe card and a performance board which is usable to inspect the wafer, said controller reads the previously provided inspection information corresponding to an inspection using the probe card and the performance board to set the probe card and the performance board.

9. The apparatus for inspecting electrical properties of a wafer of claim 8, wherein the information members are integrated circuit chips installed in the probe card and the performance board, respectively.

10. The apparatus for inspecting electrical properties of a wafer of claim 8, wherein the information members are bar codes attached to the probe card and the performance board, respectively.

11. The apparatus for inspecting electrical properties of a wafer of claim 8, wherein said reader is installed at a portion of the probe station where the probe card and said performance board are installed.

12. The apparatus for inspecting electrical properties of a wafer of claim 8, wherein said controller comprises:

a monitor that monitors the installation conditions of the probe card and the performance board and installation conditions based on the inspection information; and an operator that manually manipulates the installation conditions of the probe card and the performance board based on monitoring said monitor.

13. The apparatus for inspecting electrical properties of a wafer of claim 8, wherein said controller comprises:

a comparer that compares the installation conditions of the probe card and the performance board with installation conditions based on the inspection information; and an automatic controller that sets the installation conditions of the probe card and the performance board by automatic control based on data generated by said comparer.

14. The apparatus for inspecting electrical properties of a wafer of claim 13, wherein said automatic controller sets the installation conditions of the probe card and the performance board by automatic control according to a numerical control.

15. An apparatus for inspecting electrical properties of a wafer, comprising:

a probe station on which the wafer is mounted, said probe station including a probe card that directly contacts the wafer and a performance board that is operatively connected to the probe card, whereby electric signals are transferred to and from the wafer through probe card and the performance board;

the probe card and the performance board respectively including information members that identify a wafer type that the probe card and the performance board are usable to inspect;

a reader that reads information from the information members of the probe card and the performance board; and a controller that controls inspection of the electrical parameters of the wafer based on content of the information read by said reader and the electric signals.

16. The apparatus for inspecting electrical parameters of a wafer of claim 15, wherein the information members respectively comprise integrated circuit chips installed in the probe card and the performance board.

17. The apparatus for inspecting electrical parameters of a wafer of claim 15, wherein the information members respectively comprise bar codes attached to the probe card and the performance board.

18. The apparatus for inspecting electrical parameters of a wafer of claim 15, wherein upon determination by said controller that the probe card and the performance board are usable to inspect the wafer based on the content of the information read by said reader, said controller sets the probe card and the performance board to installation conditions previously input.

* * * * *